United States Patent
Lan et al.

(10) Patent No.: US 8,975,620 B2
(45) Date of Patent: Mar. 10, 2015

(54) ORGANIC SEMICONDUCTOR DEVICE AND MANUFACTURING METHOD THEREOF

(71) Applicant: E Ink Holdings Inc., Hsinchu (TW)

(72) Inventors: Wei-Chou Lan, Hsinchu (TW); Hsing-Yi Wu, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/868,062

(22) Filed: Apr. 22, 2013

(65) Prior Publication Data

US 2014/0042404 A1    Feb. 13, 2014

(30) Foreign Application Priority Data

Aug. 7, 2012 (TW) ............... 101128479 A

(51) Int. Cl.
| | |
|---|---|
| H01L 51/00 | (2006.01) |
| H01L 29/08 | (2006.01) |
| H01L 29/786 | (2006.01) |
| H01L 51/05 | (2006.01) |

(52) U.S. Cl.
CPC ........ H01L 51/0512 (2013.01); H01L 51/0096 (2013.01); H01L 51/0541 (2013.01); *Y02E 10/549* (2013.01)
USPC .................. 257/40; 257/43; 257/57; 257/659; 257/E29.291; 257/E51.001; 257/E51.003; 257/E51.025; 438/34; 438/50; 438/99

(58) Field of Classification Search
USPC ........ 257/40, 43, 57, 659, E29.291, E51.001, 257/E51.003, E51.025; 438/34, 50, 99
See application file for complete search history.

(56) References Cited

U.S. PATENT DOCUMENTS

| | | | |
|---|---|---|---|
| 7,867,813 B2 | 1/2011 | Halls et al. | |
| 8,330,147 B2 * | 12/2012 | Saito et al. | 257/40 |
| 2010/0283041 A1 * | 11/2010 | Nakamura et al. | 257/40 |
| 2012/0018706 A1 * | 1/2012 | Kagan et al. | 257/40 |
| 2012/0037915 A1 | 2/2012 | Kugler | |

(Continued)

FOREIGN PATENT DOCUMENTS

| | | |
|---|---|---|
| CN | 1855570 | 11/2006 |
| TW | 201131269 | 9/2011 |

(Continued)

OTHER PUBLICATIONS

"Office Action of Taiwan Counterpart Application", issued on Dec. 26, 2014, pp. 1-9.

*Primary Examiner* — Dao H Nguyen
(74) *Attorney, Agent, or Firm* — Jianq Chyun IP Office

(57) ABSTRACT

An organic semiconductor device includes a carrier, a source, a drain, an organic semiconductor single-crystalline channel layer, an organic insulation layer and a gate. The source and the drain are disposed on an upper surface of the carrier. The source and the drain are disposed in parallel and a portion of the carrier is exposed between the source and the drain. The organic semiconductor single-crystalline channel layer is disposed on the upper surface of the carrier and covers a portion of the source, a portion of the drain and the portion of the carrier exposed by the source and the drain. The organic insulation layer covers the carrier, the source, the drain and the organic semiconductor single-crystalline channel layer. The gate is disposed on the organic insulation layer and corresponds to a position of the portion of the carrier exposed by the source and the drain.

4 Claims, 15 Drawing Sheets

(56) References Cited

U.S. PATENT DOCUMENTS

2012/0162561 A1* 6/2012 Kimura .......................... 349/43
2013/0001560 A1* 1/2013 Maekawa et al. ............... 257/57
2013/0285061 A1* 10/2013 Shukla et al. ................... 257/57

FOREIGN PATENT DOCUMENTS

TW          201142955          12/2011
TW          201222676          6/2012

* cited by examiner

ORGANIC SEMICONDUCTOR DEVICE AND MANUFACTURING METHOD THEREOF

CROSS-REFERENCE TO RELATED APPLICATION

This application claims the priority benefit of Taiwan application serial no. 101128479, filed on Aug. 7, 2012. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More particularly, the invention relates to an organic semiconductor device and a manufacturing method thereof.

2. Description of Related Art

Recently, environmental protection has become more important. Thus, flat display panels with advantages such as low power consumption efficiency, space saving efficiency, the absence of radiation, and high picture quality have become a mainstream in the market. General flat panel displays include displays such as liquid crystal displays (LCD), plasma displays, organic electroluminescence displays (OLED), and electro-phoretic displays.

In order to maintain high display quality and high performance, by changing the characteristics of the semiconductor layer in the thin film transistor so as to improve the hole mobility of the thin film transistor, and further improve the display quality and performance of the display has become a major focus. It general thin film transistors (TFT), a semiconductor channel layer in a TFT is usually an amorphous silicon (a-Si) form. When this type of TFT is deformed, the electrical characteristics of the TFT will be affected. For example, the current of the TFT after the TFT is turned on is different where the TFT is deformed and where the TFT is not deformed. Thus, this type of manufacture of TFTs into flexible electronic products may cause instability when operating. As a result, if flexible electronic products are to be used extensively, then the problem of different characteristics happening when the electronic components are deformed must be overcome. Further, since the carrier mobility of amorphous silicon is less than 1 $cm^2$/Vsec, the amorphous silicon TFT can not attain the demand of high speed devices. Thus, developing material with high carrier mobility has become a major focus in the art.

SUMMARY OF THE INVENTION

The invention is related to an organic semiconductor device having better carrier mobility.

The invention provides a method of manufacturing an organic semiconductor device, adapted to manufacture the above-mentioned organic semiconductor device.

The invention provides an organic semiconductor device including a carrier, a source, a drain, an organic semiconductor single-crystalline channel layer, an organic insulation layer, and a gate. The carrier has an upper surface. The source is disposed on the upper surface of the carrier. The drain is disposed on the upper surface of the carrier. The source and the drain are disposed in parallel, and a portion of the carrier is exposed between the source and the drain. The organic semiconductor single-crystalline channel layer is disposed on the upper surface of the carrier and covers a portion of the source, a portion of the drain, and the portion of the carrier exposed by the source and the drain. The organic insulation layer covers the carrier, the source, the drain, and the organic semiconductor single-crystalline channel layer. The gate is disposed on the organic insulation layer and corresponds to a position of the portion of the carrier exposed by the source and the drain.

In an embodiment of the invention, the organic semiconductor device further includes an organic protection layer, an opening, and a transparent conductive layer. The organic protection layer is disposed on the organic insulation layer, and covers the gate. The opening passes through the organic protection layer and the organic insulation layer, and exposes a portion of the drain. The transparent conductive layer is disposed on the organic protection layer, and is connected by the opening to the drain exposed by the opening.

In an embodiment of the invention, the organic semiconductor device further includes a patterned photoresist layer. The patterned photoresist layer is disposed between the organic semiconductor single-crystalline channel layer and the gate, and the patterned photoresist layer directly covers the organic semiconductor single-crystalline channel layer.

In an embodiment of the invention, the organic semiconductor single-crystalline channel layer is made up of a plurality of organic semiconductor single-crystalline nuclei arranged in the same crystal orientation. The material of the organic semiconductor single-crystalline nuclei is, for example, pentacene or perylene diimide, but is not limited thereto.

The invention is directed to a method of manufacturing an organic semiconductor device, which includes the following steps. A carrier is provided, wherein the carrier has an upper surface. A source and a drain are formed on the upper surface of the carrier. The source and the drain are disposed in parallel, and a portion of the carrier is exposed between the source and the drain. An organic semiconductor single-crystalline nucleus is disposed on the portion of the carrier exposed by the source and the drain. An organic semiconductor solution is filled to cover the carrier, the source, and the drain. A temperature processing procedure is performed towards the carrier, so that the organic semiconductor solution forms a plurality of sub organic semiconductor single-crystalline nuclei arranged in the same direction as the organic semiconductor single-crystalline nucleus along an edge of the organic semiconductor single-crystalline nucleus. The organic semiconductor single-crystalline nucleus and the sub organic semiconductor single-crystalline nuclei make up an organic semiconductor single-crystalline material layer, and the organic semiconductor single-crystalline material layer covers the source, the drain, and the carrier. A patterned photoresist layer is formed on the organic semiconductor single-crystalline material layer. Portions of the organic semiconductor single-crystalline material layer exposed by the patterned photoresist layer are removed with the patterned photoresist layer used as an etching mask, so as to define an organic semiconductor single-crystalline channel. An organic insulation layer is formed on the carrier. The organic insulation layer covers the carrier, the source, the drain, and the organic semiconductor single-crystalline channel layer. A gate is formed on the organic insulation layer. The gate corresponds to a position of the portion of the carrier exposed by the source and the drain.

In an embodiment of the invention, before the organic semiconductor solution is filled, the organic semiconductor single-crystalline nucleus is disposed on the portion of the carrier exposed by the source and the drain.

In an embodiment of the invention, before the organic semiconductor single-crystalline nucleus is disposed, the organic semiconductor solution is filled so as to cover the carrier, the source, and the drain.

In an embodiment of the invention, the method of manufacturing the organic semiconductor device further includes removing the patterned photoresist layer before forming the organic insulation layer.

In an embodiment of the invention, the method of manufacturing the organic semiconductor device further includes the following. After forming the gate, an organic protection layer is formed on the organic insulation layer, wherein the organic protection layer covers the gate. An opening passing through the organic protection layer and the organic insulation layer is formed, and the opening exposes a portion of the drain. A transparent conductive layer is formed on the protection layer, wherein the transparent conductive layer is connected by the opening to the drain exposed by the opening.

In an embodiment of the invention, the temperature processing procedure includes continuous heating, continuous cooling, or non-continuous heating and cooling.

In an embodiment of the invention, a material of the carrier includes polyester (PET), polyethylene (PE), polypropylene (PP), epoxy resin, or high polymer material.

In an embodiment of the invention, the carrier is made up of a rigid substrate, an adhesive layer, and a flexible substrate. The adhesive layer is disposed between the rigid substrate and the flexible substrate, and the source and the drain are disposed on the flexible substrate.

Based on the above, the invention adopts an organic semiconductor single-crystalline channel layer arranged in the same crystal orientation as a semiconductor channel layer. Thus, compared to a conventional semiconductor device that uses amorphous silicon (no specific crystal orientation) as a semiconductor channel layer, the organic semiconductor device has better carrier mobility. In addition, the invention has an organic semiconductor single-crystalline nucleus as a seed, and an organic semiconductor solution forms a plurality of sub organic semiconductor single-crystalline nuclei arranged in the same direction as the organic semiconductor single-crystalline nucleus along an edge of the organic semiconductor single-crystalline nucleus, further defining an organic semiconductor single-crystalline channel layer. Thus, the method of manufacturing the organic semiconductor device can effectively reduce the time for forming the organic semiconductor single-crystalline channel layer, and allows the crystal orientation of forming the organic semiconductor single-crystalline nuclei to be the same. Therefore, the organic semiconductor device of the invention has better carrier mobility.

In order to make the aforementioned and other features and advantages of the invention more comprehensible, embodiments accompanying figures are described in detail below.

DESCRIPTION OF EMBODIMENTS

Figure 1A:
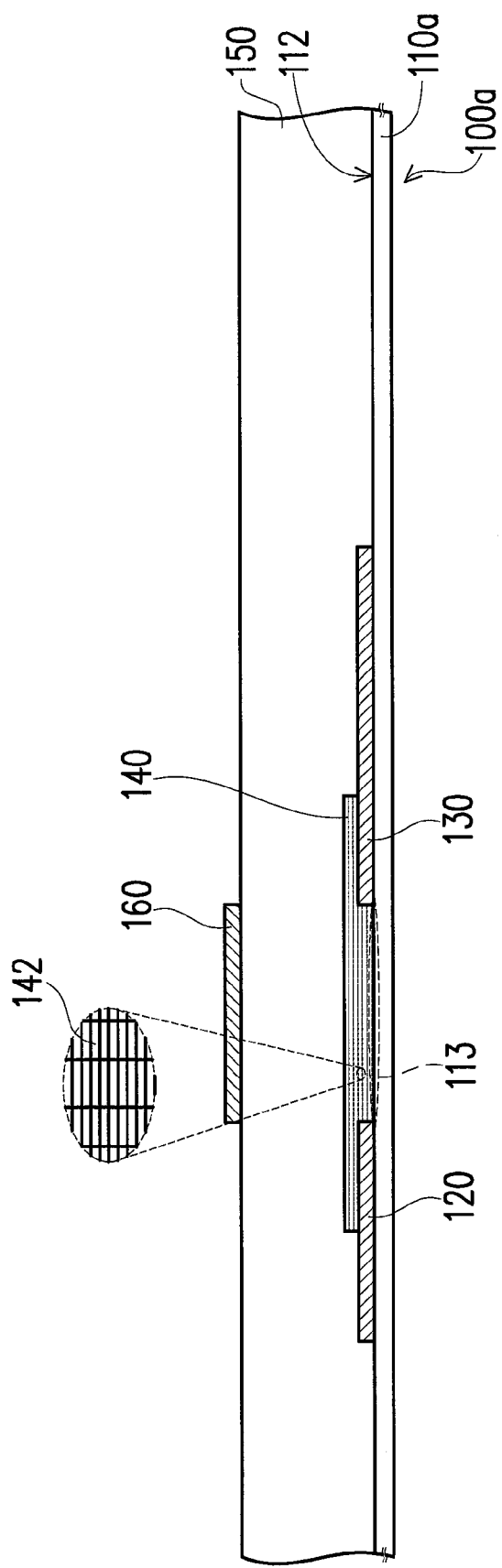
FIG. 1A is a schematic cross-sectional view of an organic semiconductor device according to an embodiment of the invention.

FIG. 1A is a schematic cross-sectional view of an organic semiconductor device according to an embodiment of the invention. Referring to FIG. 1A, an organic semiconductor device 100a of the embodiment includes a carrier 110a, a source 120, a drain 130, an organic semiconductor single-crystalline channel layer 140, an organic insulation layer 150, and a gate 160. The organic semiconductor device 100a is, for example, an organic TFT.

In detail, the carrier 110a includes an upper surface 112. The carrier 110a is, for example, a flexible substrate, and a material of the carrier includes polyester (PET), polyethylene (PE), polypropylene (PP), epoxy resin, or high polymer material, but is not limited thereto. The source 120 is disposed on the upper surface 112 of the carrier 110a. The drain 130 is also disposed on the upper surface 112 of the carrier 110a. The source 120 and the drain 130 are disposed in parallel, and a portion 113 of the carrier 110a is exposed between the source 120 and the drain 130. The organic semiconductor single-crystalline channel layer 140 is disposed on the upper surface 112 of the carrier 110a and covers a portion of the source 120, a portion of the drain 130, and the portion 113 of the carrier 110a exposed by the source 120 and the drain 130. The organic insulation layer 150 covers the carrier 110a, the source 120, the drain 130, and the organic semiconductor single-crystalline channel layer 140. The gate 160 is disposed on the organic insulation layer 150 and corresponds to a position of the portion 113 of the carrier 110a exposed by the source 120 and the drain 130.

Specifically, the organic semiconductor single-crystalline channel layer 140 of the embodiment is made up of a plurality of organic semiconductor single-crystalline nuclei 142 arranged in the same crystal orientation. That is to say, the crystal orientation of the organic semiconductor single-crystalline nuclei 142 of the organic semiconductor single-crystalline channel layer 140 are the same (same direction). Thus, when compared to conventional semiconductor devices that adopt amorphous silicon (no specific crystal orientation) as a semiconductor channel layer, the organic semiconductor device 110a of the embodiment has better carrier mobility. FIG. 1C(a) to FIG. 1C(d) are schematic views showing a plurality of arrangement directions of organic semiconductor single-crystalline nuclei of an organic semiconductor device according to an embodiment of the invention. The crystal orientation of the organic semiconductor single-crystalline nuclei 142 of the embodiment are the same (same direction), and the organic semiconductor single-crystalline nuclei 142 can be according to the long axis direction of the molecules of the organic semiconductor. As shown in FIG. 1C(a), the organic semiconductor single-crystalline nuclei 142a1 are arranged in multiple rows. The rows are shown as orderly staggered with respect to each other. Or, as shown in FIG. 1C(b), the organic semiconductor single-crystalline nuclei 142a2 are arranged in multiple rows. The rows are shown as irregularly staggered with respect to each other. Or, as shown in FIG. 1C(c), the organic semiconductor single-crystalline nuclei 142a3 are arranged in multiple rows. The rows are shown as arranged in a matrix. Or, the crystal orientation of the organic semiconductor single-crystalline nuclei 142 are the same (same direction), and the organic semiconductor single-crystalline nuclei 142 can be according to the short axis direction of the molecules of the organic semiconductor. As shown in FIG. 1C(d), the organic semiconductor single-crystalline nuclei 142a4 are arranged in multiple columns. The columns are shown as orderly staggered with respect to each other, but is not limited thereto. In addition, since the organic semiconductor device 100a of the embodiment adopts a flexible substrate as the carrier 110a, thus the organic semiconductor device 100a can be flexible.

Figure 1B:
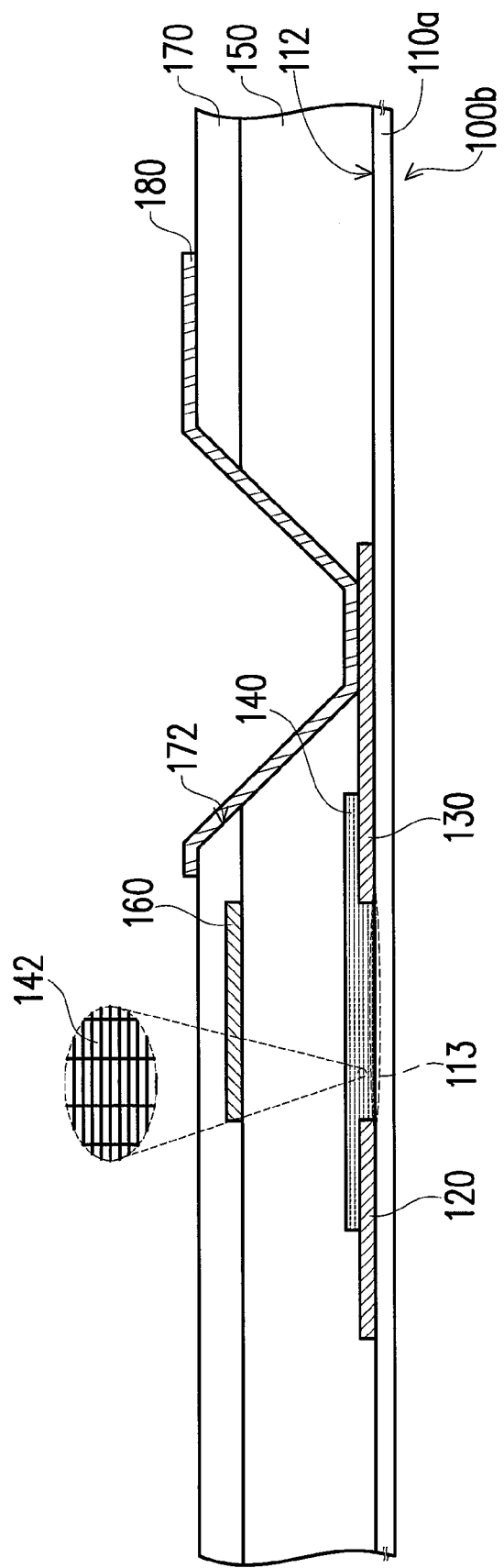
FIG. 1B is a schematic cross-sectional view of another organic semiconductor device according to an embodiment of the invention.
Figure 1C:
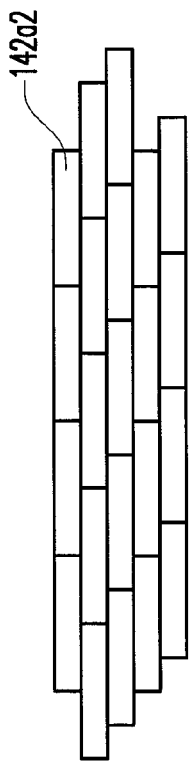
FIG. 1C(a) to FIG. 1C(d) are schematic views showing a plurality of arrangement directions of organic semiconductor single-crystalline nuclei of an organic semiconductor device according to an embodiment of the invention.
Figure 1C:
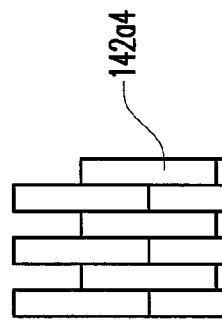
Figure 1C:
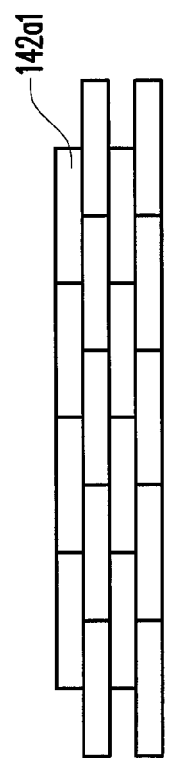
Figure 1C:
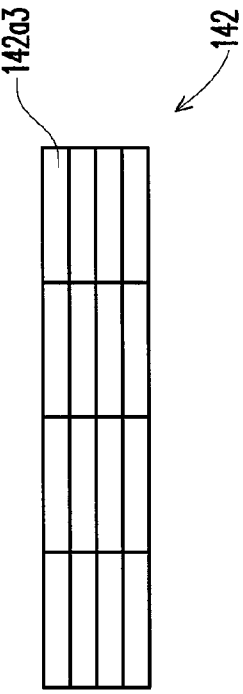

FIG. 1B is a schematic cross-sectional view of another organic semiconductor device according to an embodiment of the invention. The embodiment uses the same reference numerals for similar components in the previous embodiment, and omits repeated description of the same features. The omitted features not described in the embodiment can be referred to in the previous embodiment, and will not be repeated herein. Referring to FIG. 1B, the difference between the organic semiconductor device 100b and the organic semiconductor device 100a of the FIG. 1A is that the organic semiconductor device 100b is, for example, a pixel structure. The source 120, the drain 130, the organic semiconductor single-crystalline channel layer 140, the organic insulation layer 150, and the gate 160 define an organic TFT.

In detail, the organic semiconductor device 100b of the embodiment further includes an organic protection layer 170, an opening 172, and a transparent conductive layer 180. The organic protection layer 170 is disposed on the organic insulation layer 150, and covers the gate 160. The opening 172 passes through the organic protection layer 170 and the organic insulation layer 150, and the opening 172 exposes a portion of the drain 130. The transparent conductive layer 180 is disposed on the organic protection layer 170, and is electrically connected by the opening 172 to the drain 172 exposed by the opening 130.

Since the embodiment adopts an organic semiconductor single-crystalline channel layer arranged in the same crystal orientation as a semiconductor channel layer, thus, compared to a conventional semiconductor device that uses amorphous silicon (no specific crystal orientation) as a semiconductor channel layer, the organic semiconductor device of the embodiment has better carrier mobility. This further allows the organic semiconductor device 100b (as a pixel structure) to complete the input of data voltage in a limited data input time. Therefore, when a subsequent display (not shown) adopts the organic semiconductor device 100b of the embodiment, the display quality of the display can be effectively improved.

Figure 2:
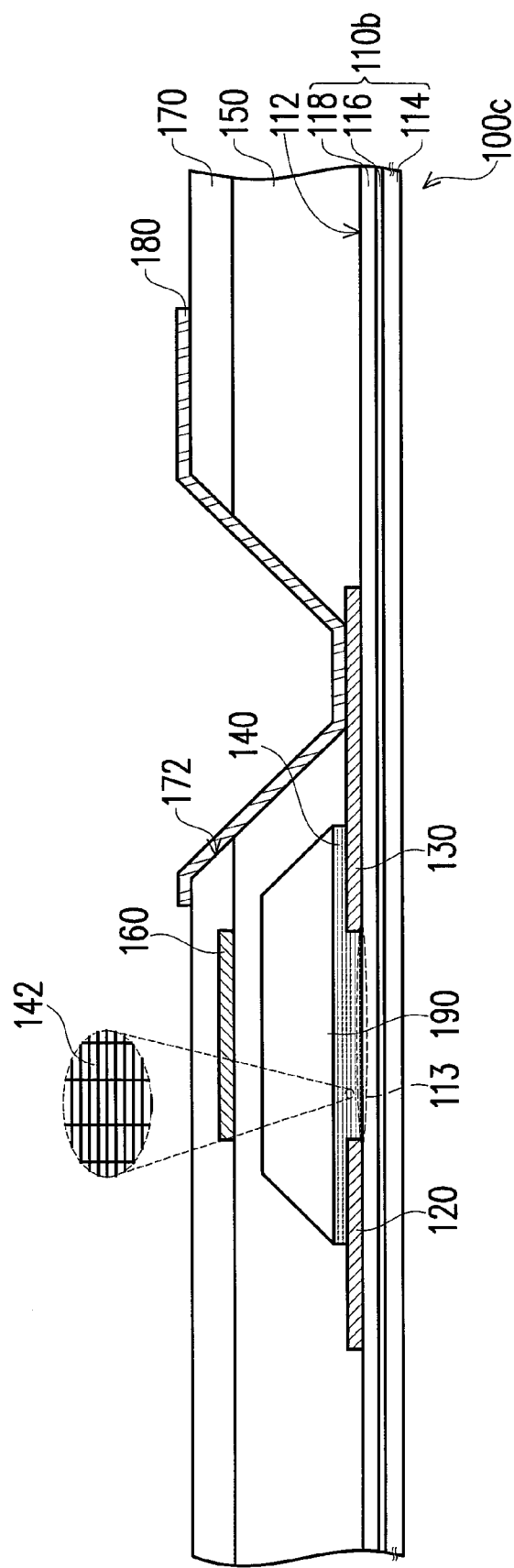
FIG. 2 is a schematic cross-sectional view of another organic semiconductor device according to an embodiment of the invention.

FIG. 2 is a schematic cross-sectional view of another organic semiconductor device according to an embodiment of the invention. The embodiment uses the same reference numerals for similar components in the previous embodiment, and omits repeated description of the same features. The omitted features not described in the embodiment can be referred to in the previous embodiment, and will not be repeated herein. Referring to FIG. 2, the difference between the organic semiconductor device 100c and the organic semiconductor device 100b of the FIG. 1B is that the carrier 110b is different from the carrier 110a of the previous embodiments. Because of some factors in manufacturing, the organic semiconductor device 100c of the embodiment further includes a patterned photoresist layer 190, so as to protect the organic semiconductor single-crystalline channel layer 140.

In detail, the carrier 110b of the embodiment is made up of a rigid substrate 114, an adhesive layer 116, and a flexible substrate 118. The adhesive layer 116 is disposed between the rigid substrate 114 and the flexible substrate 118. The flexible substrate 118 is temporarily bonded with the rigid substrate 114 through the adhesive layer 116, and the source 120 and the drain 130 are disposed on the flexible substrate 118. It should be noted that the rigid substrate 114 can provide enough support to support the stacking of the above elements during the manufacturing process. After the manufacturing process is complete, if the organic semiconductor device 100c is desired to be flexible, the adhesive layer 116 can be separated from the flexible substrate 118 (i.e. removing the rigid substrate 114 and the adhesive layer 116). This forms the structure of the carrier 110a of FIG. 1B. This step is optional, and the invention is not limited thereto. That is to say, the structure of the carriers 110a, 110b can be selectively chosen according to the descriptions above, and are not used to further limit the invention. In addition, the patterned photoresist layer 190 of the embodiment is disposed between the organic semiconductor single-crystalline channel layer 140 and the gate 160. The patterned photoresist layer 190 directly covers the organic semiconductor single-crystalline channel layer 140, and can further effectively protect the organic semiconductor single-crystalline channel layer 140 so as to prevent damage by oxygen from moisture, further improving reliability of the device.

The structures of the organic semiconductor devices 100a, 100b, 100c are described above. A manufacturing method of the organic semiconductor devices 100a, 100b, 100c have not yet been introduced. The following describes a method of manufacturing the organic semiconductor devices 100a, 100b, 100c with FIGS. 3A to 3I, and FIGS. 4A and 4B.

FIG. 3A to FIG. 3I are schematic cross-sectional views of a method of manufacturing an organic semiconductor device according to an embodiment of the invention. According to the method of manufacturing the organic semiconductor device 100a, please refer to FIG. 3A. A carrier 110b is provided, wherein the carrier 110b has an upper surface 112. The carrier 110b is made up of a rigid substrate 114, an adhesive layer 116, and a flexible substrate 118. The adhesive layer 116 is located between the rigid substrate 114 and the flexible substrate 118. The flexible substrate 118 is temporarily bonded with the rigid substrate 114 through the adhesive layer 116. The rigid substrate 114 can provide enough support to support the stacking of the above elements during the manufacturing process. Herein, a material of the flexible substrate 118 includes polyester (PET), polyethylene (PE), polypropylene (PP), epoxy resin, or high polymer material, but is not limited thereto.

Figure 3A:
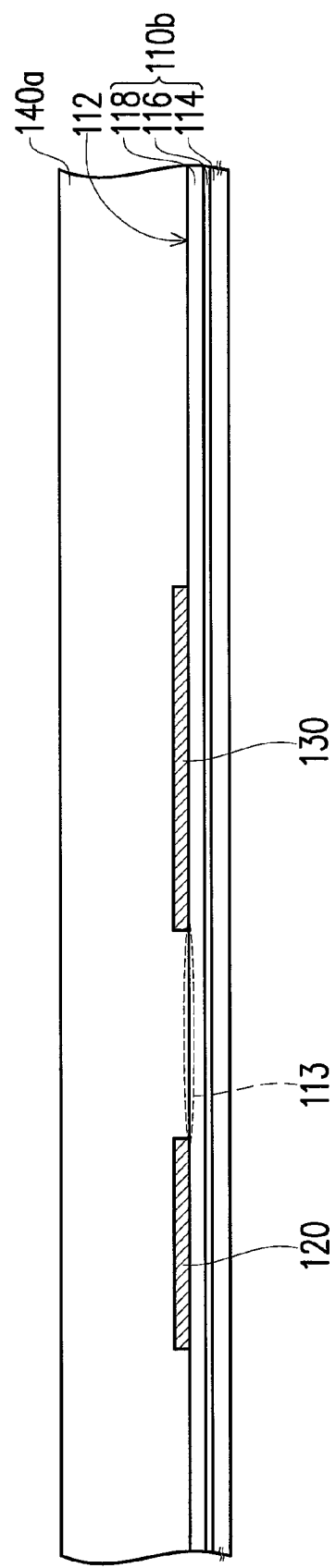
FIG. 3A to FIG. 3I are schematic cross-sectional views of a method of manufacturing an organic semiconductor device according to an embodiment of the invention.

Next, referring to FIG. 3A, a source 120 and a drain 130 are formed on the upper surface 112 of the carrier 110b. The source 120 and the drain 130 are disposed in parallel on the flexible substrate 118, and a portion 113 of the carrier 110b is exposed between the source 120 and the drain 130. Next, an organic semiconductor solution 140a is filled to cover the carrier 110b, the source 120, and the drain 130. Herein, the organic semiconductor solution 140a is, for example, made up of an organic solvent (not shown, such as propylene glycol monomethyl ether acetate (PGMEA) or tetramethyl ammonium hydroxide (TMAH), but is not limited thereto), and an organic solute (not shown, such as pentacene or perylene diimide, but is not limited thereto).

Figure 3B:
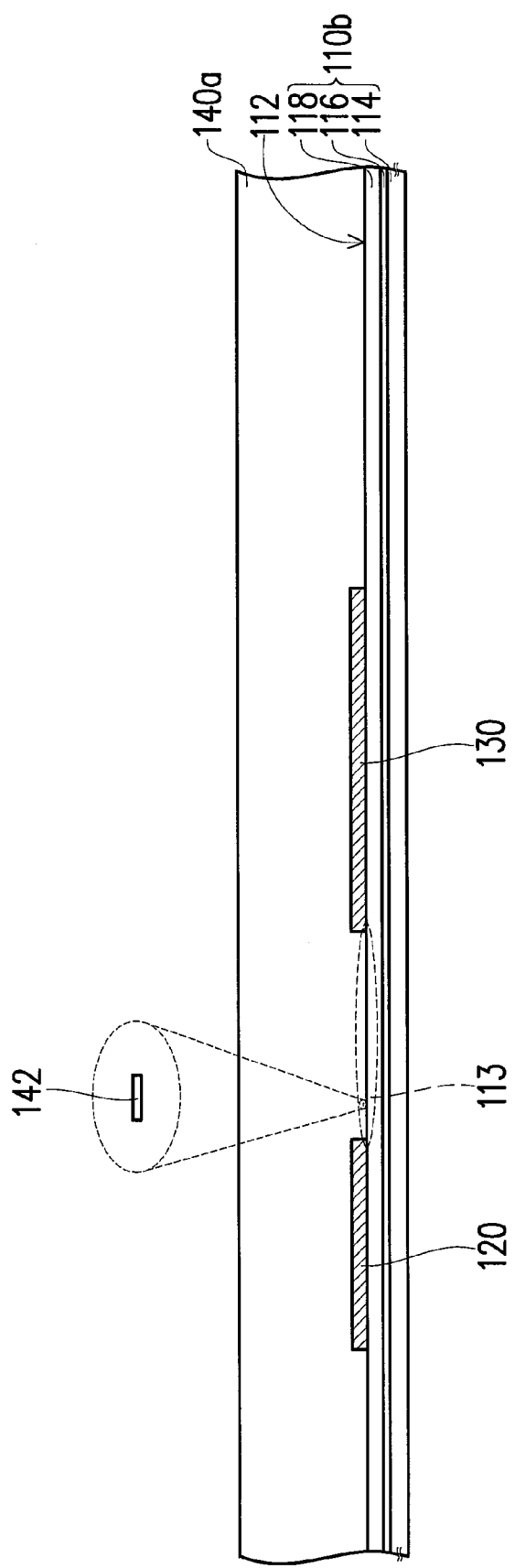

Next, referring to FIG. 3B, an organic semiconductor single-crystalline nucleus 142 is disposed on the portion 113 of the carrier 110b exposed by the source 120 and the drain 130. Herein, the organic semiconductor single-crystalline nucleus 142 has a specific crystal orientation, used as an example for subsequent grain growth. The material of the organic semiconductor single-crystalline nucleus 142 is, for example, pentacene or perylene diimide, but is not limited thereto.

Of course, the invention does not limit the order of filling the organic semiconductor solution 140a and disposing the organic semiconductor single-crystalline nucleus 142. The manufacturing steps of the embodiment disclose filling the organic semiconductor solution 140a first, and then disposing the organic semiconductor single-crystalline nucleus 142 on the portion 113 of the carrier 110b exposed by the source 120 and the drain 130. However, in other embodiments, referring to FIG. 4A, the organic semiconductor single-crystalline nucleus 142 is disposed first, and referring to FIG. 4B, and then the organic semiconductor solution 140a is filled so as to cover the carrier 110b, the source 120, and the drain 130. The two manufacturing sequences mentioned above still belong to a technical means adoptable in the invention and falls within the protection scope of the invention.

Figure 3C:
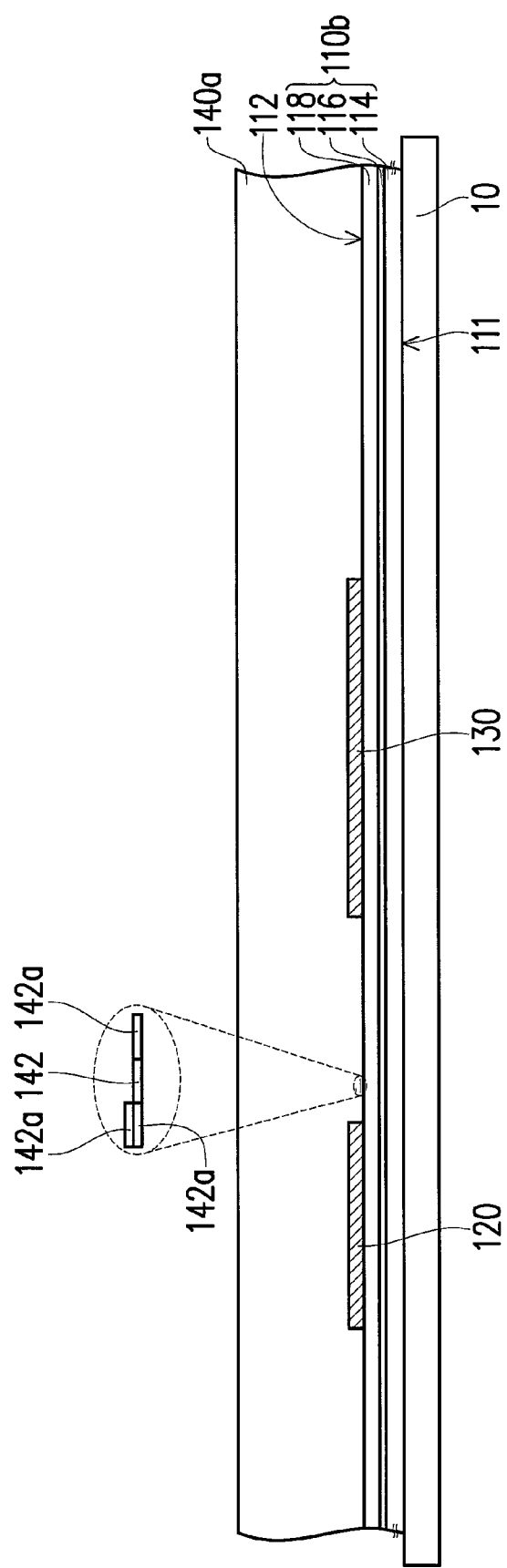

Next, referring to FIG. 3C, a heating/cooling plate 10 is provided on a lower surface 111 opposite to the upper surface 112 of the carrier 110b, so as to perform temperature processing procedure towards the carrier 110b. This way, the organic semiconductor solution 140a forms a plurality of sub organic semiconductor single-crystalline nuclei 142a arranged in the same direction as the organic semiconductor single-crystalline nucleus 142 along an edge of the organic semiconductor single-crystalline nucleus 142. Herein, performing the temperature processing procedure includes continuous heating, continuous cooling, or non-continuous heating and cooling. The different temperature processing procedures can be selected according to different characteristics of the organic semiconductor solution 140a, so as to lower the limit of dissolution and perform grain growth.

Figure 3D:
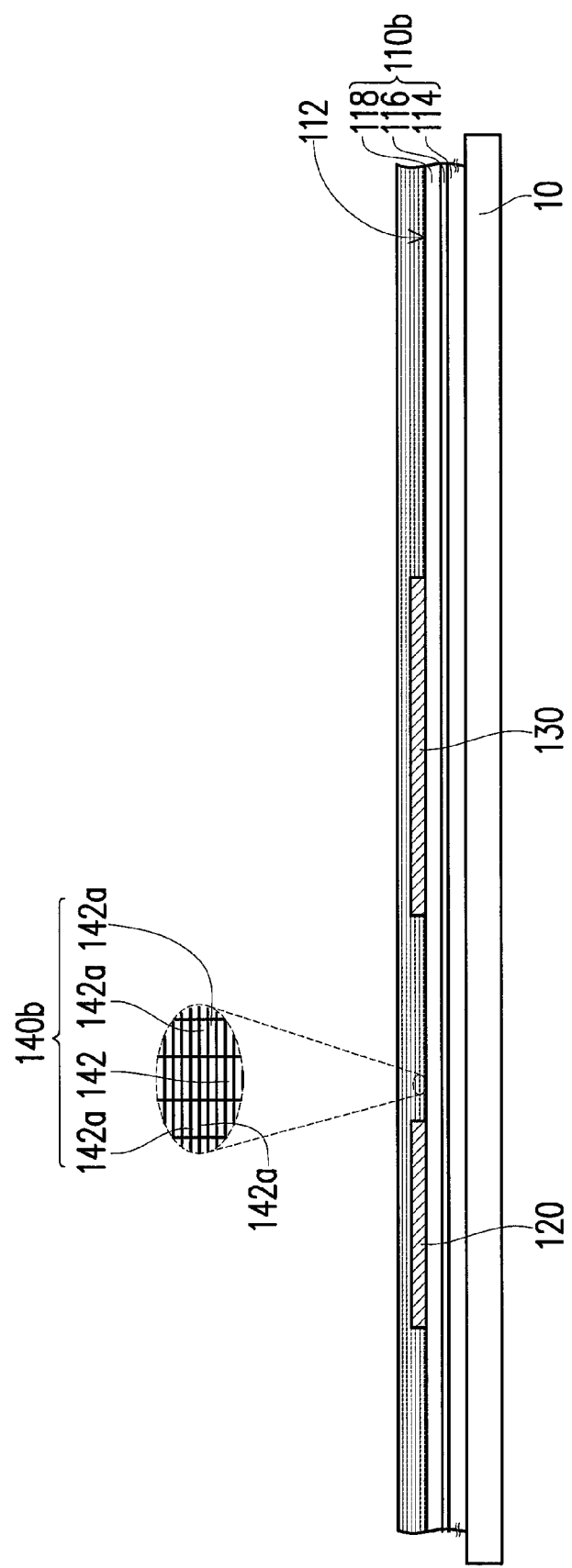

Next, referring to FIG. 3D, the organic semiconductor single-crystalline nucleus 142 and the sub organic semiconductor single-crystalline nuclei 142a make up an organic semiconductor single-crystalline material layer 140b, and the organic semiconductor single-crystalline material layer 140b covers the source 120, the drain 130, and the carrier 110b.

The embodiment has the organic semiconductor single-crystalline nucleus 142 as a seed, and an organic semiconductor solution 140a forms a plurality of sub organic semiconductor single-crystalline nuclei 142a arranged in the same direction as the organic semiconductor single-crystalline nucleus 142 along an edge of the organic semiconductor single-crystalline nucleus 142, further defining an organic semiconductor single-crystalline channel layer 140b. Thus, compared to conventional grain growth procedures, the embodiment can effectively reduce the growth time of the grain growth (i.e. the sub organic semiconductor single-crystalline nuclei 142a), and can allow the formed sub organic semiconductor single-crystalline nuclei 142a to have the same crystal orientation as the organic semiconductor single-crystalline nucleus 142 (i.e. crystal). Simply put, the embodiment can form the sub organic semiconductor single-crystalline nuclei 142a with the same crystal orientation as the organic semiconductor single-crystalline nucleus 142, through one organic semiconductor single-crystalline nucleus 142, in a short amount of time.

Figure 3E:
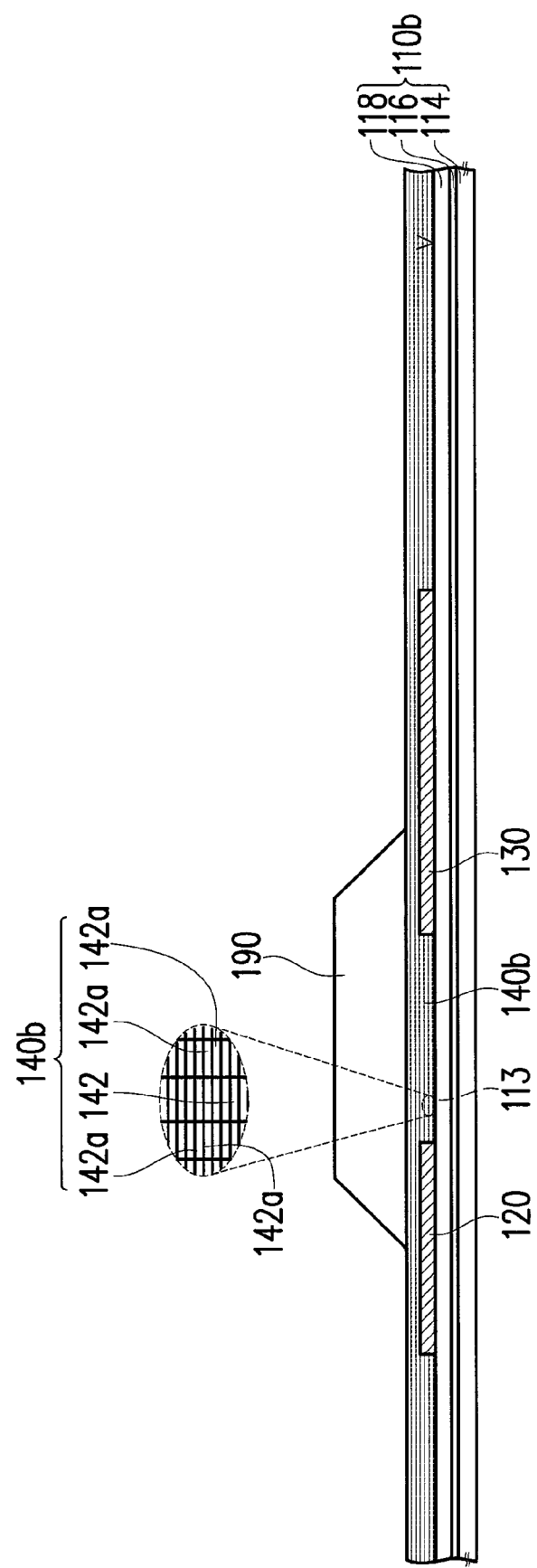

Next, referring to FIG. 3E, the heating/cooling plate 10 is removed, and a patterned photoresist layer 190 is formed on the organic semiconductor single-crystalline material layer 140b.

Figure 3F:
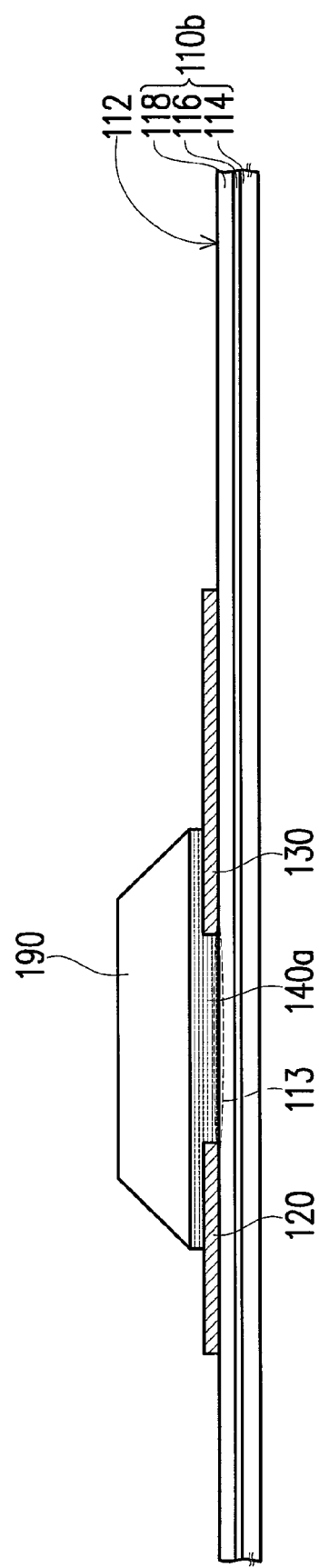

Next, referring to FIG. 3F, portions of the organic semiconductor single-crystalline material layer 140b exposed by the patterned photoresist layer 190 with the patterned photoresist layer 190 used as an etching mask are removed, so as to define an organic semiconductor single-crystalline channel 140. Herein, the organic semiconductor single-crystalline channel layer 140 is disposed on the upper surface 112 of the carrier 110b, and covers a portion of the source 120, a portion of the drain 130, and the portion 113 of the carrier 110b exposed by the source 120 and the drain 130. Specifically, the organic semiconductor single-crystalline channel layer 140 of the embodiment is made up of a plurality of organic semiconductor single-crystalline nuclei 142 and a plurality of sub organic semiconductor single-crystalline nuclei 142a arranged in the same crystal orientation. That is to say, the crystal orientation of the organic semiconductor single-crystalline nuclei 142 and the sub organic semiconductor single-crystalline nuclei 142a of the organic semiconductor single-crystalline channel layer 140 are the same (same direction). Thus, when compared to conventional semiconductor devices that adopt amorphous silicon (no specific crystal orientation) as a semiconductor channel layer, the organic semiconductor device 110a of the embodiment has better carrier mobility.

Figure 3G:
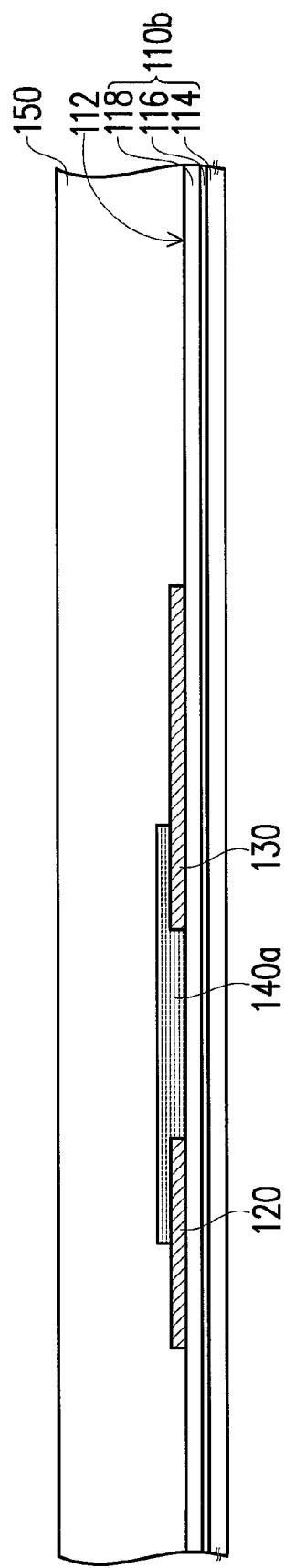

Next, referring to FIG. 3G, the patterned photoresist layer 190 is selectively removed. That is to say, after the organic semiconductor single-crystalline channel layer 140 is formed, the patterned photoresist layer 190 is selectively removed according to the material characteristics of the organic semiconductor single-crystalline channel layer 140. Herein, as shown in FIG. 3G, the first patterned photoresist layer 190 is, for example, removed for description.

Then, referring to FIG. 3G, an organic insulation layer 150 is formed on the carrier 110b. The organic insulation layer 150 covers the carrier 110b, the source 120, the drain 130, and the organic semiconductor single-crystalline channel layer 140a. Of course, in other embodiments, referring to FIG. 2, if the patterned photoresist layer 190 has not be removed, then the organic insulation layer 150 directly covers the carrier 110b, the source 120, the drain 130, and indirectly covers the organic semiconductor single-crystalline channel layer 140a.

Figure 3H:
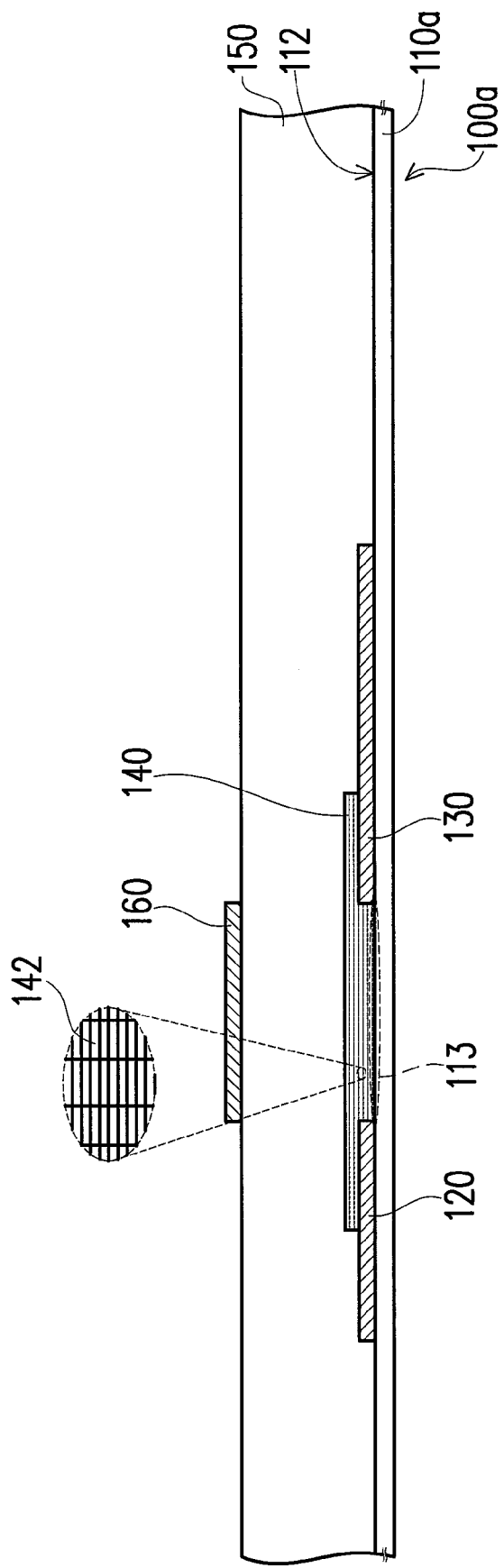

Finally, referring to FIG. 3H, the gate 160 is formed on the organic insulation layer 150. The gate 160 corresponds to a position of the portion 113 of the carrier 110b exposed by the source 120 and the drain 130. Next, again referring to FIG. 3G and FIG. 3H, the rigid substrate 114 and the adhesive layer 116 of the carrier 110b can be selectively removed, forming a carrier 110a, and completing the manufacture of the organic semiconductor device 100a. Herein, the organic semiconductor device 100a is, for example, a thin film transistor.

Figure 3I:
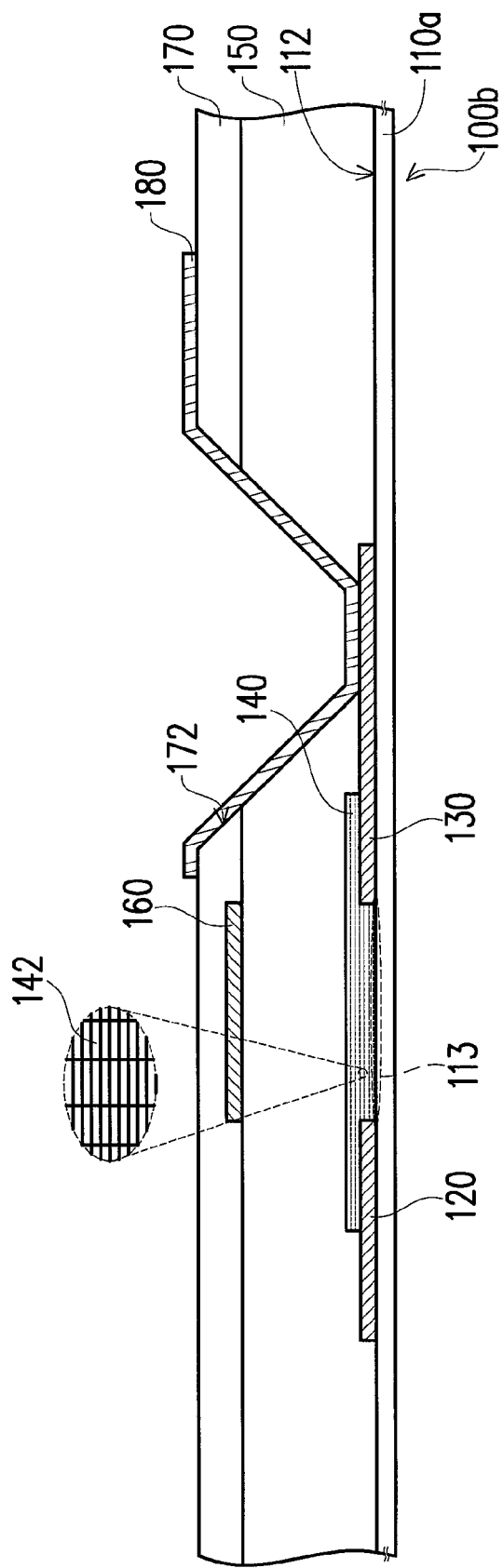
Figure 4A:
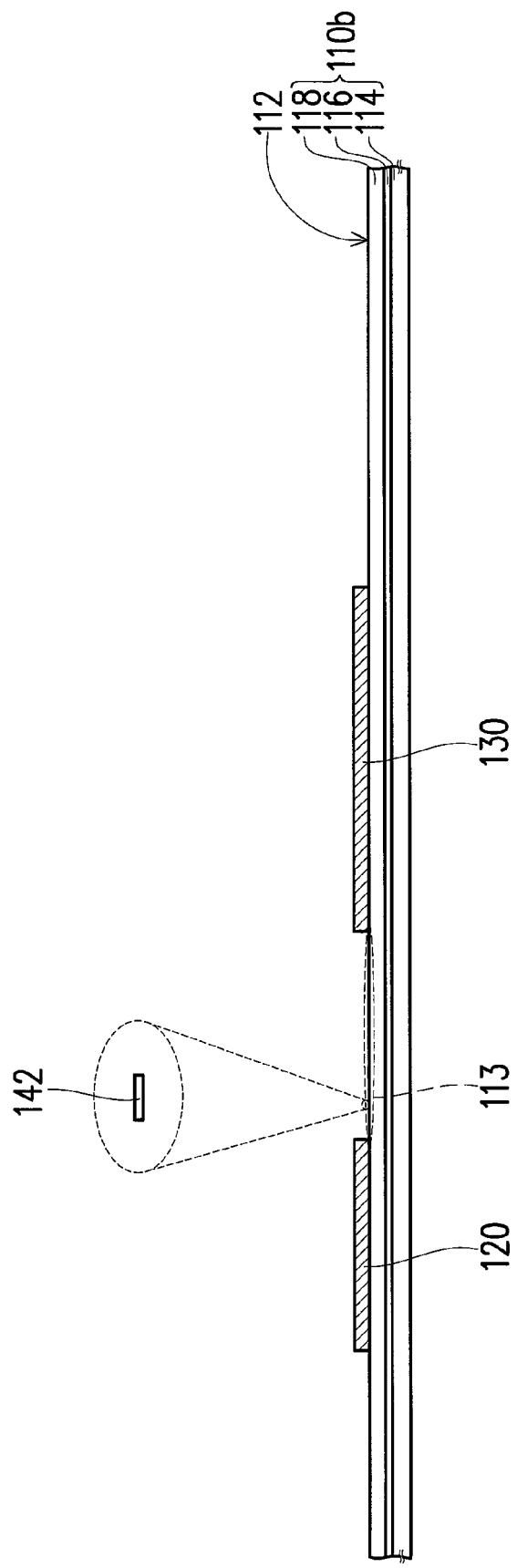
FIG. 4A to FIG. 4B are schematic cross-sectional views of partial steps of a method of manufacturing another organic semiconductor device according to an embodiment of the invention.
Figure 4B:
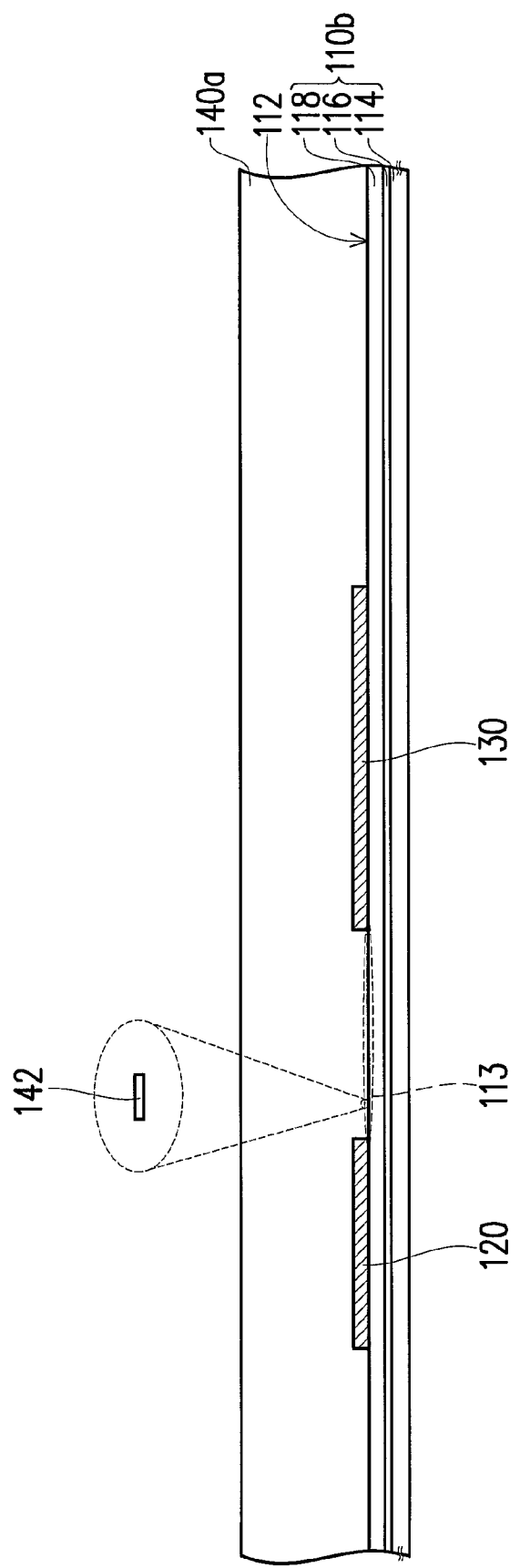

Furthermore, referring to FIG. 3I, after forming the gate 160, an organic protection 170 is also formed on the organic insulation layer 150, wherein the organic protection layer 170 covers the gate 160. Next, an opening 172 passing through the organic protection layer 170 and the organic insulation layer 150 is formed. The opening 172 exposes a portion of the drain 130. Next, a transparent conductive layer 180 is formed on the organic protection layer 170, and is electrically connected by the opening 172 to the drain 130 exposed by the opening 172. Thereby, the manufacture of the organic semiconductor device 100b is complete. Herein, the organic semiconductor device 100b is, for example, a pixel structure.

Of course, if in the step of FIG. 3G the patterned photoresist layer 190 is not removed, and in the step of FIG. 3H the rigid substrate 114 and the adhesive layer 116 are not removed from the carrier 110b, then after the step of FIG. 3I (i.e. after forming the organic protection layer 170 and the transparent conductive layer 180), the organic semiconductor device 100c of FIG. 2 is formed.

To sum up, the invention adopts an organic semiconductor single-crystalline channel layer arranged in the same crystal orientation as a semiconductor channel layer. Thus, compared to a conventional semiconductor device that uses amorphous silicon (no specific crystal orientation) as a semiconductor channel layer, the organic semiconductor device has better carrier mobility. In addition, the invention has an organic semiconductor single-crystalline nucleus as a seed, and an organic semiconductor solution forms a plurality of sub organic semiconductor single-crystalline nuclei arranged in the same direction as the organic semiconductor single-crystalline nucleus along an edge of the organic semiconductor single-crystalline nucleus, further defining an organic semiconductor single-crystalline channel layer. Thus, the method of manufacturing the organic semiconductor device can effectively reduce the time for forming the organic semiconductor single-crystalline channel layer, and allows the crystal orientation of forming the organic semiconductor single-crystalline nuclei to be the same. Therefore, the organic semiconductor device of the invention has better carrier mobility.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An organic semiconductor device, comprising:
   a carrier, having an upper surface;
   a source, disposed on the upper surface of the carrier;
   a drain, disposed on the upper surface of the carrier, wherein the source and the drain are disposed in parallel, and a portion of the carrier is exposed between the source and the drain;
   an organic semiconductor single-crystalline channel layer, disposed on the upper surface of the carrier and covering a portion of the source, a portion of the drain, and the portion of the carrier exposed by the source and the drain;
   an organic insulation layer, covering the carrier, the source, the drain, and the organic semiconductor single-crystalline channel layer; and
   a gate, disposed on the organic insulation layer and corresponding to a position of the portion of the carrier exposed by the source and the drain.

2. The organic semiconductor device as claimed in claim 1, further comprising:
   an organic protection layer, disposed on the organic insulation layer, and covering the gate;
   an opening, passing through the organic protection layer and the organic insulation layer, and exposing a portion of the drain; and
   a transparent conductive layer, disposed on the organic protection layer, and connected by the opening to the drain exposed by the opening.

3. The organic semiconductor device as claimed in claim 1, further comprising:
   a patterned photoresist layer, disposed between the organic semiconductor single-crystalline channel layer and the gate, wherein the patterned photoresist layer directly covers the organic semiconductor single-crystalline channel layer.

4. The organic semiconductor device as claimed in claim 1, wherein the organic semiconductor single-crystalline channel layer is made up of a plurality of organic semiconductor single-crystalline nuclei arranged in a same crystal orientation.

* * * * *